(12) United States Patent
Liu et al.

(10) Patent No.: US 8,748,238 B2
(45) Date of Patent: Jun. 10, 2014

(54) ULTRA HIGH VOLTAGE SIGE HBT AND MANUFACTURING METHOD THEREOF

(71) Applicant: Shanghai Hua Hong NEC Electronics Co., Ltd., Shanghai (CN)

(72) Inventors: Donghua Liu, Shanghai (CN); Jing Shi, Shanghai (CN); Wenting Duan, Shanghai (CN); Wensheng Qian, Shanghai (CN); Jun Hu, Shanghai (CN)

(73) Assignee: Shanghai Hua Hong NEC Electronics Co., Ltd., Shanghai (CN)

( * ) Notice: Subject to any disclaimer, the term of this patent is extended or adjusted under 35 U.S.C. 154(b) by 15 days.

(21) Appl. No.: 13/680,506

(22) Filed: Nov. 19, 2012

(65) Prior Publication Data

US 2013/0126945 A1    May 23, 2013

(30) Foreign Application Priority Data

Nov. 21, 2011 (CN) .......................... 2011 1 0370460

(51) Int. Cl.
*H01L 21/335* (2006.01)

(52) U.S. Cl.
USPC ........................................ 438/142

(58) Field of Classification Search
CPC ............... H01I 21/76898; H01I 21/10876; H01L 29/0817; H01L 29/41708; H01L 29/66242; H01L 29/7371
USPC ........................................... 438/142
See application file for complete search history.

(56) References Cited

U.S. PATENT DOCUMENTS

| | | | |
|---|---|---|---|
| 6,054,344 A * | 4/2000 | Liang et al. | 438/223 |
| 8,273,610 B2 * | 9/2012 | Or-Bach et al. | 438/142 |
| 2004/0212034 A1 | 10/2004 | Mochizuki et al. | |
| 2005/0017306 A1 * | 1/2005 | Morishita | 257/355 |
| 2011/0140233 A1 | 6/2011 | Qian et al. | |
| 2011/0156202 A1 | 6/2011 | Chiu et al. | |

* cited by examiner

*Primary Examiner* — Charles Garber
*Assistant Examiner* — Andre' C Stevenson
(74) *Attorney, Agent, or Firm* — MKG, LLC

(57) ABSTRACT

An ultra high voltage silicon-germanium (SiGe) heterojunction bipolar transistor (HBT) is disclosed, in which, a collector region is formed between two isolation structures; a pseudo buried layer is formed under each isolation structure and each side of the collector region is connected with a corresponding pseudo buried layer; a SiGe field plate is formed on each of the isolation structures; each pseudo buried layer is picked up by a first contact hole electrode and each SiGe field plate is picked up by a second contact hole electrode; and each first contact hole electrode is connected to its adjacent second contact hole electrode and the two contact hole electrodes jointly serve as an emitter. A manufacturing method of the ultra high voltage SiGe HBT is also disclosed.

11 Claims, 3 Drawing Sheets

ULTRA HIGH VOLTAGE SIGE HBT AND MANUFACTURING METHOD THEREOF

CROSS-REFERENCES TO RELATED APPLICATIONS

This application claims the priority of Chinese patent application number 201110370460.X, filed on Nov. 21, 2011, the entire contents of which are incorporated herein by reference.

TECHNICAL FIELD

The present invention pertains to a heterojunction bipolar transistor (HBT), and more particularly, to a silicon-germanium (SiGe) HBT.

BACKGROUND

With the development of modern mobile communication and microwave communication as well as demands for high-performance, low-noise and low-cost radio frequency (RF) components, traditional silicon devices can no longer meet new requirements on technical specifications, output power and linearity. Therefore, SiGe HBT devices have been proposed which play an important role in the applications of high-frequency power amplifiers. Compared with gallium arsenide (GaAs) devices, though SiGe HBT devices are at a disadvantage in frequency performance, they can well solve the issue of heat dissipation accompanying with power amplification, benefiting from their better thermal conductivities and good mechanical capacities of their substrates. Moreover, SiGe HBT devices also have better linearity and higher integration level. Further, SiGe HBT devices are well compatible with the conventional silicon process and still belong to the silicon-based technology and the complementary metal oxide semiconductor (CMOS) process, thus reducing manufacturing cost. For these reasons, the SiGe BiCMOS (bipolar complementary metal oxide semiconductor) process provides great convenience for the integration of power amplifiers and logic control circuits.

Currently, silicon-germanium (SiGe) heterojunction bipolar transistors (HBTs) have been widely adopted internationally as high-frequency, high-power amplifier devices for wireless communication products such as power amplifiers and low-noise amplifiers used in mobile phones. In order to improve the output power of an RF power amplifier, it is an effective method to increase its operating current or operating voltage within the normal ranges. Those SiGe HBTs having high breakdown voltages are popularly used because they consume less electric power by allowing a circuit to operate under a smaller current with the same power consumption. Therefore, further increasing the breakdown voltage of a SiGe HBT without deteriorating its characteristic frequency is more and more focused in the research of SiGe HBTs.

SUMMARY OF THE INVENTION

An objective of the present invention is to provide an ultra-high-voltage silicon-germanium (SiGe) heterojunction bipolar transistor (HBT) having a high voltage resistance property. To this end, the present invention is also to provide a method of manufacturing the ultra-high-voltage SiGe HBT.

To achieve the above objective, the SiGe HBT provided by the present invention includes: a substrate; two trenches formed in the substrate, each of the trenches having an isolation structure formed therein; two pseudo buried layers, each being formed under a corresponding one of the trenches; a collector region formed between the isolation structures, each side of the collector region being connected with a corresponding one of the pseudo buried layers; and two SiGe field plates, each being formed on one of the isolation structures, wherein each of the pseudo buried layers is picked up via a first contact hole electrode formed in a corresponding isolation structure; each of the SiGe field plates is picked up via a second contact hole electrode formed thereon; and each second contact hole electrode is connected to its adjacent first contact hole electrode so that the two electrodes jointly serve as a collector.

In an embodiment, each of the pseudo buried layers has a doping concentration greater than that of the collector region.

In an embodiment, each of the SiGe field plates is situated above where the collector region is connected with the corresponding one of the pseudo buried layers.

In an embodiment, the SiGe HBT further includes: a SiGe base region formed on the collector region, the SiGe base region being situated between the SiGe field plates and not being connected to either of the SiGe field plates; and a polysilicon emitter formed on the SiGe base region.

The method of manufacturing ultra-high-voltage SiGe HBT includes:

forming two trenches in a substrate;

forming a pseudo buried layer under each of the trenches;

forming an isolation structure in each of the two trenches and a collector region between the isolation structures, each side of the collector region being connected with a corresponding one of the pseudo buried layers;

forming a SiGe field plate on each isolation structure;

forming a first contact hole electrode in each isolation structure for picking up a corresponding pseudo buried layer and forming a second contact hole electrode on each SiGe field plate for picking up the corresponding SiGe field plate; and connecting each first contact hole electrode to its adjacent second contact hole electrode so that the two electrodes jointly serve as a collector.

In an embodiment, the pseudo buried layer is formed by ion implantation with an implantation dose of $1\times10^{14}$ atoms/cm$^2$ to $1\times10^{16}$ atoms/cm$^2$ and an implantation energy of 2 KeV to 50 KeV.

In an embodiment, the collector region is formed by ion implantation with an implantation dose of $2\times10^{12}$ atoms/cm$^2$ to $5\times10^{14}$ atoms/cm$^2$ and an implantation energy of 30 KeV to 350 KeV.

In an embodiment, the step of forming a SiGe field plate on each isolation structure includes:

epitaxially growing a SiGe epitaxial layer on a surface of the substrate; and etching the SiGe epitaxial layer to form a SiGe field plate on each isolation structure.

In an embodiment, a SiGe base region is also formed during the process of etching the SiGe epitaxial layer, and the formed SiGe base region is situated between the SiGe field plates and is not connected to either of the SiGe field plates.

In an embodiment, the method further includes forming a polysilicon emitter region on the SiGe epitaxial layer after epitaxially growing a SiGe epitaxial layer and before etching the SiGe epitaxial layer.

In an embodiment, the SiGe epitaxial layer is in-situ doped during the epitaxial growth to achieve a doping concentration of $1\times10^{19}$ atoms/cm$^3$ to $7\times10^{19}$ atoms/cm$^3$ of the SiGe epitaxial layer.

In a conventional SiGe HBT, a buried layer is formed under the collector region, and a contact hole electrode connected to the buried layer is needed to be formed in the active region between the isolation structures to pick up the collector region, which leads to a relatively big size and area of the device.

In contrast, instead of forming a buried layer under the collector region as adopted in the conventional structure, in the ultra-high-voltage SiGe HBT of the present invention, buried layers, also referred to as pseudo buried layers, are formed under the isolation structures on respective sides of the collector region, and each side of the collector region is connected with one of the pseudo buried layers. With such a design, contact hole electrodes are allowed to be formed in the respective isolation structures, and each of the contact hole electrodes is connected to a corresponding one of the pseudo buried layers to pick up the collector region, thus the size and area of the device is greatly reduced.

Moreover, the B-C junction (namely, the P-N junction between the base and the collector regions) of a conventional SiGe HBT is a one-dimensional depletion region model, i.e., there is only vertical extension of the depletion in the direction from the SiGe base region to the substrate; while in the ultra-high-voltage SiGe HBT of the present invention, the pseudo buried layers are heavily doped with an N-type impurity whilst the collector region is lightly doped, and the collector region has a depth greater than those of the isolation structures and is connected with a pseudo buried layer on both of its opposing sides, or in other words, the collector region has an extension portion on both sides located under the respective isolation structures. Such design provides a B-C junction having a two-dimensional distribution in which there is not only vertical extension in the direction from the SiGe base region to the substrate but also horizontal extension in the directions from the SiGe base region to the pseudo buried layers. Therefore, the B-C junction of the present invention has a higher breakdown voltage of the junction, which also leads to a higher breakdown voltage BVCEO of the SiGe HBT.

Further, there is no semiconductor field plate formed on the isolation structures of a conventional SiGe HBT; while in the ultra-high-voltage SiGe HBT of the present invention, SiGe field plates are formed on the isolation structures, and are more preferred to be formed respectively right above where the pseudo buried layers join with the collector region. These SiGe field plates are conducive to improve electric field distribution within the collector region and thus can further increase the breakdown voltage of the SiGe HBT.

DETAILED DESCRIPTION

Figure 1:
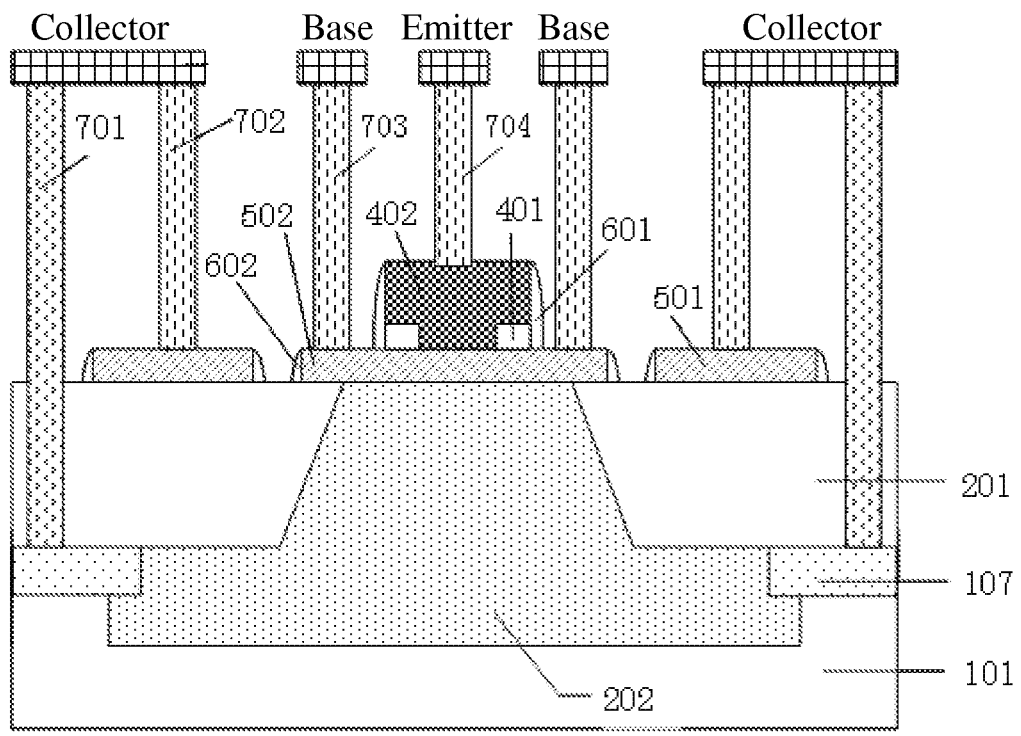
FIG. 1 is a schematic diagram illustrating the structure of an ultra-high-voltage SiGe HBT according to the present invention.

FIG. 1 illustrates a structure of an ultra-high-voltage SiGe HBT according to an embodiment of the present invention. It differs from a conventional SiGe HBT in the following key points.

Firstly, there is no buried layer formed under the collector region in the present invention instead of the conventional structure having a buried layer formed under the collector region of a SiGe HBT; instead, pseudo buried layers are formed under isolation structures on respective sides of the collector region and are connected with the corresponding side of the collector region in the present invention.

Secondly, there is no semiconductor field plates formed on isolation structures of a conventional SiGe HBT, while SiGe field plates are formed on the isolation structures in the present invention.

Thirdly, in a conventional SiGe HBT, a contact hole electrode is formed in the active region to pick up the buried layer under the collector region so as to serve as a collector; while in the present invention, a first contact hole electrode picking up a pseudo buried layer and an adjacent second contact hole electrode picking up a SiGe field plate are connected to each other and thereby jointly server as a collector, wherein the first contact hole electrode is not in contact with the active region.

A method of manufacturing the ultra-high-voltage SiGe HBT of the present invention includes the following steps.

Figure 2A:
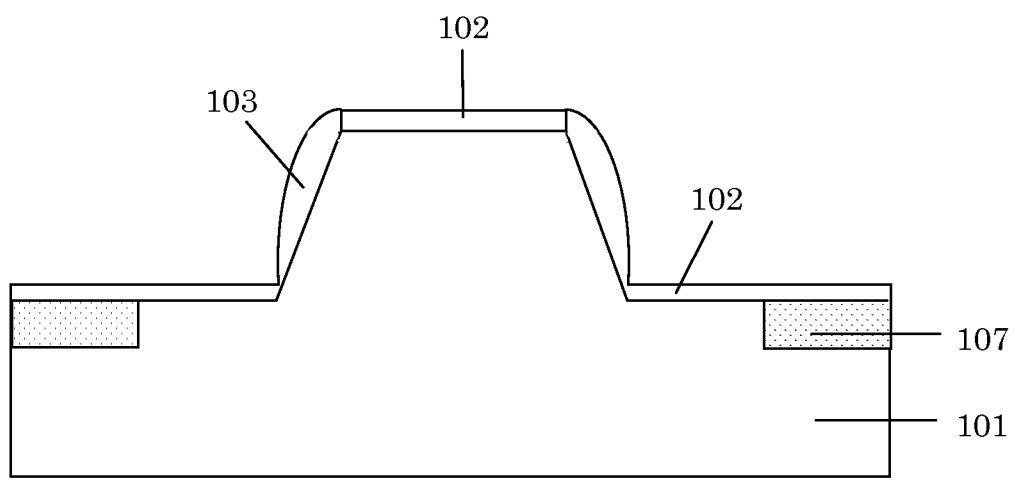
FIGS. 2a to 2f schematically illustrate structures in various steps of a manufacturing method of the ultra-high-voltage SiGe HBT according to the present invention.

Step 1: as shown in FIG. 2a, first, a semiconductor substrate (which is a silicon substrate in a general case) 101 is etched to form trenches therein; next, a silicon oxide layer is deposited onto the surface of the substrate 101, and then an anisotropic etching process is applied to the silicon oxide layer such that a thin silicon oxide layer 102 is remained over the surface of the substrate 101 and bottoms of the trenches, and silicon oxide inner sidewalls 103 are formed over inner side faces of each of the trenches; and after that, an N-type impurity is implanted into bottoms of the trenches with a high dose and a low energy to form two N-type pseudo buried layers 107 at bottoms of the respective trenches, wherein the N-type impurity is, for example, phosphorus; the high implantation dose is, for example, from $1\times10^{14}$ atoms/cm$^2$ to $1\times10^{16}$ atoms/cm$^2$; and the low energy is, for example, from 2 KeV to 50 KeV. In this step, the areas of the junctions formed between the N-type pseudo buried layers 107 and the substrate 101 are relatively small because of the low-energy ion implantation process, which results in low parasitic capacitances between the N-type pseudo buried layers 107 and the substrate 101.

Figure 2B:
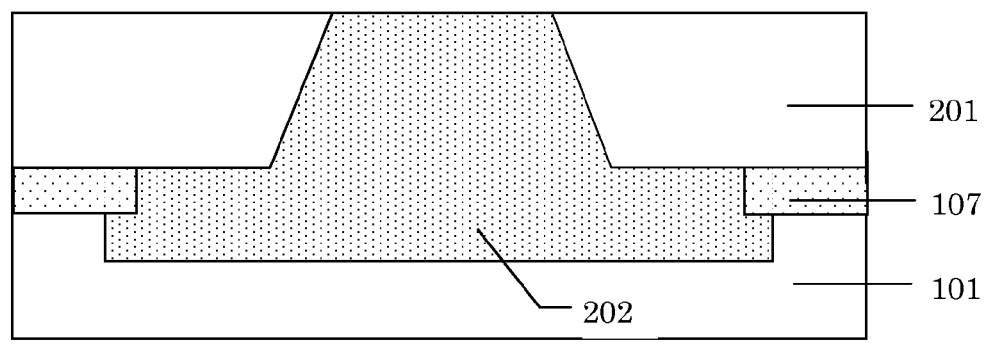

Step 2: as shown in FIG. 2b, a dielectric material is filled into each of the trenches and is joined with the portion of the silicon oxide layer 102 deposited on the bottom of the trenches and with the inner sidewalls 103 of the trenches, wherein the dielectric material is preferred to be silicon oxide; next, isolation structures 201 are formed in the respective trenches by a planarization process, wherein the planarization process is, for example, a dry etch-back process or a chemical mechanical polishing (CMP) process, and the stop layer of the etching or polishing is the upper surface of the substrate 101; after that, an N-type impurity is implanted into the active region (namely, the portion of the substrate 101 sandwiched by the isolation structures 201) with a medium-to-low dose and a medium-to-high energy to form a collector region 202 therein, wherein the N-type impurity is, for example, phosphorus; the medium-to-low implantation dose is, for example, from $2\times10^{12}$ atoms/cm$^2$ to $5\times10^{14}$ atoms/cm$^2$; the medium-to-high energy is, for example, from 30 KeV to 350 KeV; and the collector region 202 formed has a depth greater than those of the isolation structures 201 and is connected with the pseudo buried layers 107 on corresponding sides of it.

Figure 2C:
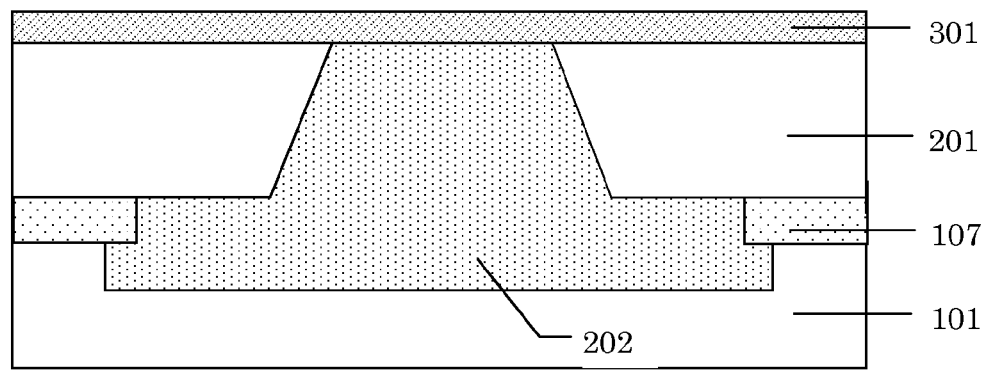

Step 3: as shown in FIG. 2c, a SiGe epitaxial layer 301 is formed over the isolation structures 201 and the collector region 202 by an epitaxial growth process, and the SiGe epitaxial layer 301 is doped by, for example, an in-situ doping process during the epitaxial growth with a P-type impurity, wherein the doping concentration is from $1\times10^{19}$ atoms/cm$^3$ to $7\times10^{19}$ atoms/cm$^3$ and the P-type impurity is preferred to be boron.

Figure 2D:
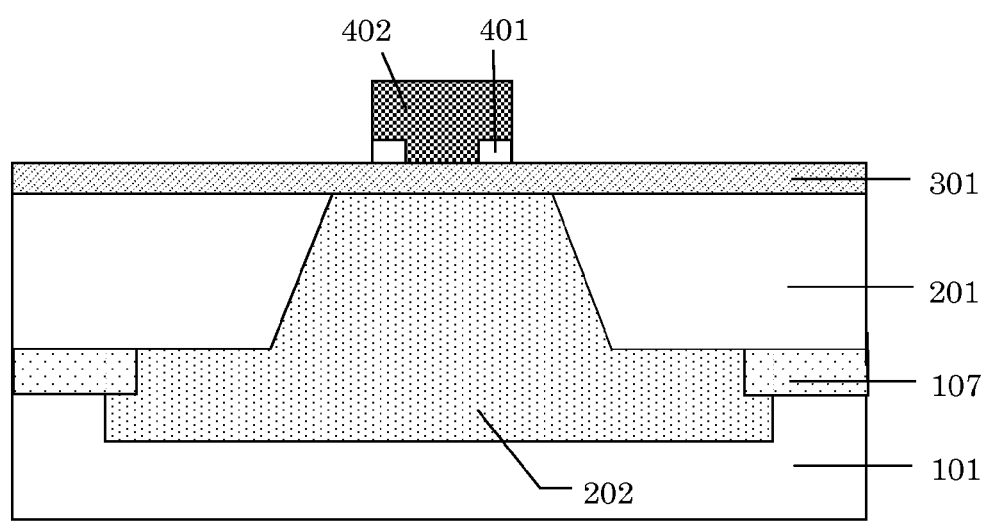

Step 4: as shown in FIG. 2d, first, a dielectric layer 401, which is, for example, silicon oxide, is deposited on the SiGe epitaxial layer 301, and an emitter window, namely, the region where a T-shaped polysilicon emitter region 402 and the SiGe epitaxial layer 301 contact with each other, is formed by using lithographic and etching process in the dielectric layer 401. The emitter window is located above a portion of the SiGe epitaxial layer 301; next, a polysilicon layer 402 is deposited on the dielectric layer 401, doped with an N-type impurity by an in-situ doping process, or by an ion implantation process with a high dose of the N-type impurity after polysilicon is deposited, or by the combination of the above two processes, and preferably, annealed thereafter, wherein the N-type impurity doped in the polysilicon layer 402 is arsenic or phosphorus and its doping concentration is higher than $2\times10^{15}$ atoms/cm$^3$; and after that, etching the polysilicon layer 402 and the dielectric layer 401 by using lithographic and etching process to only remain a T-shaped portion of the polysilicon layer 402, which serves as a polysilicon emitter region 402, situated above a corresponding portion of the upper surface of the collector region 202 and portions of the dielectric layer 401 which are also situated above the corresponding portion of the upper surface of the collector region 202 and are situated under respective extending portions of the T-shaped polysilicon emitter region 402.

Figure 2E:
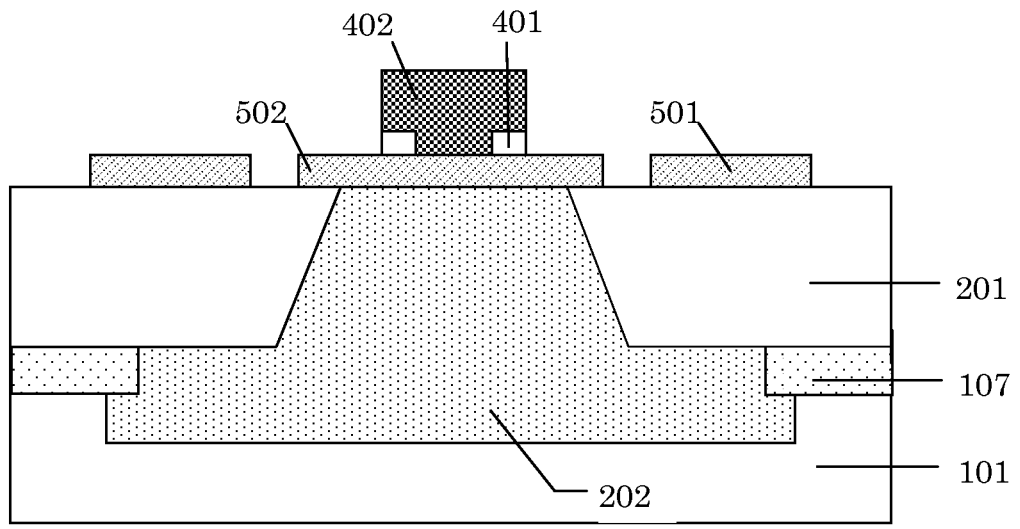

Step 5: as shown in FIG. 2e, etching the SiGe epitaxial layer 301 by using lithographic and etching process to form a SiGe field plates 501 on each of the isolation structures 201 and a SiGe base region 502 on the collector region 202, wherein, each end of the SiGe base region 502 may be situated on a corresponding isolation structure 201, or in other words, the width of the SiGe base region 502 is greater than that of the upper surface of the collector region 202; neither of the SiGe field plates 501 is connected to the SiGe base region 502; and each of the SiGe field plates 501 is situated above where the collector region 202 is connected with the corresponding one of the pseudo buried layers 107.

Figure 2F:
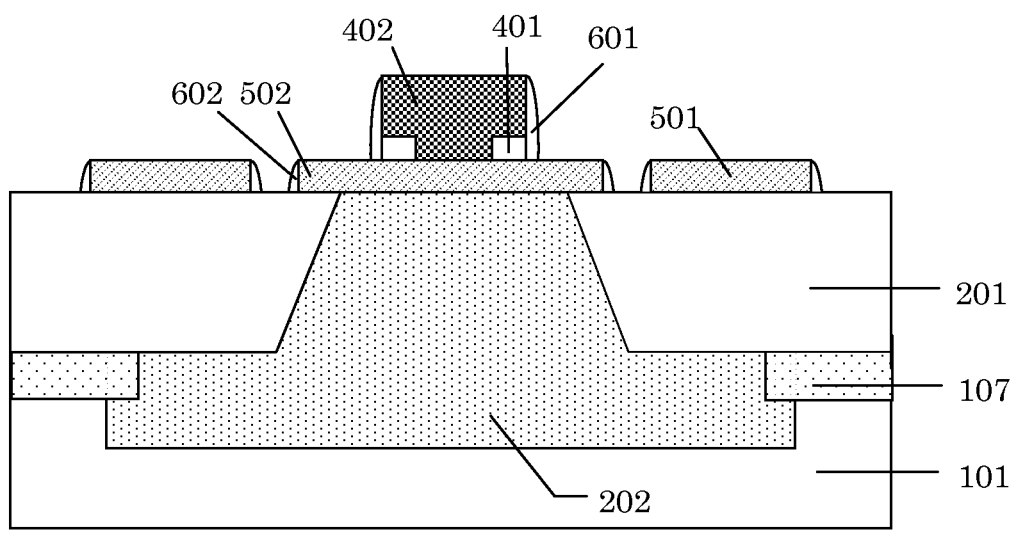

Step 6: as shown in FIG. 2f, a dielectric layer, which is, for example, silicon oxide, is deposited and is thereafter etched by using a dry etch-back process, so as to form two sidewalls 601 over respective side faces of a body consisted of the remaining portions of the dielectric layer 401 and the polysilicon emitter region 402 and to form two sidewalls 602 over respective side faces of each of the SiGe base region 502 and the SiGe field plates 501.

Step 7: as shown in FIG. 1, an inter-layer dielectric (ILD) layer (not shown in FIG. 1) is deposited, and through holes are formed in the ILD layer and the isolation structures 201, including first through holes 701 which are formed through the ILD layer and the corresponding isolation structures 201 and end at the upper surfaces of the corresponding pseudo buried layers 107; second through holes 702 which are formed through the ILD layer and end at the upper surfaces of the corresponding SiGe field plates 501; third through holes 703 which are formed through the ILD layer and end at the upper surface of the SiGe base region 502; and a fourth through hole 704 which is formed through the ILD layer and ends at the upper surface of the polysilicon emitter region 402. After that, a metal is filled into all of these through holes so as to form contact hole electrodes therein; an electrode in the first through hole 701 and an electrode in the second through hole 702 formed above the same isolation structure jointly serve as a collector; electrodes in the third through holes 703 serve as base electrodes and an electrode in the fourth through hole 704 serves as an emitter. As the first through holes 701 are near to the device (active region), the collector resistance will not be too large and the collector parasitic capacitance can be reduced.

The metal is filled into the through holes to form the contact hole electrodes by using, for example, a tungsten plug process which includes: first performing a physical vapor deposition (PVD) process to deposit a titanium metal layer over the whole surface of the structure such that a titanium pad is formed covering the bottom and inner side faces of each through hole; then performing a chemical vapor deposition (CVD) process to deposit a titanium nitride layer over the surface of the titanium metal layer; after that, performing another CVD process to deposit tungsten metal into the through holes until tungsten metal completely fills all the through holes and thereby forms tungsten plugs therein; and at last, removing the deposited layers by a CMP process or other planarization processes until the upper surface of the ILD layer is reached.

While preferred embodiments have been presented in the foregoing description, they are not intended to limit the invention in any way. Those skilled in the art can make various modifications and variations without departing from the spirit or scope of the invention. Thus, it is intended that the present invention embraces all such alternatives, modifications and variations.

What is claimed is:

1. A silicon-germanium (SiGe) heterojunction bipolar transistor (HBT), comprising:
    a substrate;
    two trenches formed in the substrate, each of the trenches having an isolation structure formed therein;
    two pseudo buried layers, each being formed under a corresponding one of the trenches;
    a collector region formed between the isolation structures, each side of the collector region being connected with a corresponding one of the pseudo buried layers; and
    two SiGe field plates, each being formed on one of the isolation structures,
    wherein each of the pseudo buried layers is picked up via a first contact hole electrode formed in a corresponding isolation structure; each of the SiGe field plates is picked up via a second contact hole electrode formed thereon; and each second contact hole electrode is connected to its adjacent first contact hole electrode so that the two electrodes jointly serve as a collector.

2. The SiGe HBT according to claim 1, wherein each of the pseudo buried layers has a doping concentration greater than that of the collector region.

3. The SiGe HBT according to claim 1, wherein each of the SiGe field plates is situated above where the collector region is connected with the corresponding one of the pseudo buried layers.

4. The SiGe HBT according to claim 1, further comprising:
    a SiGe base region formed on the collector region, the SiGe base region being situated between the SiGe field plates and not being connected to either of the SiGe field plates; and
    a polysilicon emitter formed on the SiGe base region.

5. A method of manufacturing silicon-germanium (SiGe) heterojunction bipolar transistor (HBT), comprising:
    forming two trenches in a substrate;
    forming a pseudo buried layer under each of the trenches;
    forming an isolation structure in each of the two trenches and a collector region between the isolation structures, each side of the collector region being connected with a corresponding one of the pseudo buried layers;

forming a SiGe field plate on each isolation structure;

forming a first contact hole electrode in each isolation structure for picking up a corresponding pseudo buried layer and forming a second contact hole electrode on each SiGe field plate for picking up the corresponding SiGe field plate; and connecting each first contact hole electrode to its adjacent second contact hole electrode so that the two electrodes jointly serve as a collector.

6. The method according to claim 5, wherein the pseudo buried layer is formed by ion implantation with an implantation dose of $1\times10^{14}$ atoms/cm$^2$ to $1\times10^{16}$ atoms/cm$^2$ and an implantation energy of 2 KeV to 50 KeV.

7. The method according to claim 5, wherein the collector region is formed by ion implantation with an implantation dose of $2\times10^{12}$ atoms/cm$^2$ to $5\times10^{14}$ atoms/cm$^2$ and an implantation energy of 30 KeV to 350 KeV.

8. The method according to claim 5, wherein forming a SiGe field plate on each isolation structure includes:

epitaxially growing a SiGe epitaxial layer on a surface of the substrate; and etching the SiGe epitaxial layer to form a SiGe field plate on each isolation structure.

9. The method according to claim 8, wherein a SiGe base region is also formed during the process of etching the SiGe epitaxial layer, and the formed SiGe base region is situated between the SiGe field plates and is not connected to either of the SiGe field plates.

10. The method according to claim 8, further comprising forming a polysilicon emitter region on the SiGe epitaxial layer after epitaxially growing a SiGe epitaxial layer and before etching the SiGe epitaxial layer.

11. The method according to claim 8, wherein the SiGe epitaxial layer is in-situ doped during the epitaxial growth to achieve a doping concentration of $1\times10^{19}$ atoms/cm$^3$ to $7\times10^{19}$ atoms/cm$^3$ of the SiGe epitaxial layer.

* * * * *